United States Patent [19]

Tanaka

[11] 4,292,552

[45] Sep. 29, 1981

[54] BIPOLAR VOLTAGE DETECTOR COMPRISING DIFFERENTIAL TRANSISTOR PAIRS

[75] Inventor: Kouichi Tanaka, Tokyo, Japan

[73] Assignee: Nippon Electric Co., Ltd., Tokyo, Japan

[21] Appl. No.: 971,148

[22] Filed: Dec. 19, 1978

[30] Foreign Application Priority Data

Dec. 20, 1977 [JP] Japan .................................. 52-153935

[51] Int. Cl.³ ........................ H03K 5/153; H03K 5/08
[52] U.S. Cl. .................................... 307/354; 307/236; 307/261; 307/360
[58] Field of Search ............... 307/236, 261, 268, 354, 307/360; 330/261

[56] References Cited

U.S. PATENT DOCUMENTS

| | | | |
|---|---|---|---|
| 3,593,035 | 7/1971 | Martens | 307/360 |
| 3,743,945 | 7/1973 | Sellari, Jr. | 307/360 X |
| 4,061,932 | 12/1977 | Cordell | 307/354 X |
| 4,088,905 | 5/1978 | Comer | 307/261 X |

*Primary Examiner*—John Zazworsky

*Attorney, Agent, or Firm*—Sughrue, Mion, Zinn, Macpeak and Seas

[57] ABSTRACT

A bipolar voltage detector comprises first and second transistors having emitter electrodes grounded through a first constant-current circuit for a preselected current, third and fourth transistors having emitter electrodes grounded through a second constant-current circuit for the preselected current, and a power supply terminal for a power supply voltage. Base bias voltages supplied to the first and third transistors are rendered higher than those for the second and fourth transistors, respectively. Collector electrodes of the first and third transistors are connected to the power supply terminal. Responsive to a bipolar input signal superposed on the base bias voltages of the second and third transistors, a sequence of output pulses that rise and fall when the input signal exceeds the differences between the base bias voltages of the first and second transistors and between those of the third and fourth transistors is produced as an output signal from those collector electrodes of the second and fourth transistors which are coupled to the power supply terminal. The base bias voltages are preferably derived by potential dividers consisting essentially of resistors.

3 Claims, 7 Drawing Figures

BIPOLAR VOLTAGE DETECTOR COMPRISING DIFFERENTIAL TRANSISTOR PAIRS

BACKGROUND OF THE INVENTION

This invention relates to a bipolar voltage detector.

A bipolar voltage detector or comparator has a wide field of application and is implemented by a monolithic integrated circuit at present. The detector is used, for example, in a noise suppressor for use in the circuitry described by L. Calandrino et al in "Alta Frequenza," Volume XXXVI, Pages 726–731 (No. 8; August, 1967). As will later be described in detail with reference to FIGS. 1 and 2 of the accompanying drawing, conventional bipolar voltage detectors are deficient in that the voltage detection levels are considerably dependent on the ambient temperature and the power supply voltage, and in that the detector has to comprise a good number of circuit elements, such as capacitors, attached to that principal portion of the detector which is realized as a monolithic integrated circuit.

SUMMARY OF THE INVENTION

It is therefore one object of the present invention to provide a bipolar voltage detector, the voltage detection levels of which are substantially independent of the ambient temperature and the power supply voltage.

It is another object of this invention to provide a bipolar voltage detector that needs only one capacitor.

It is still another object of this invention to provide a bipolar voltage detector of the type described, which is suitable for implementation by a monolithic integrated circuit.

A bipolar voltage detector according to this invention is capable of producing output pulses that quickly rise.

Furthermore, a bipolar voltage detector according to this invention facilitates the design of an amplifier used in a stage prior to the detector.

A bipolar voltage detector to which this invention is applicable comprises an input terminal for a bipolar input signal, an output terminal for an output signal, a power supply terminal for a power supply voltage, and transistor means connected to the input, the output, and the power supply terminals and having threshold levels predetermined for positive and negative components of the input signal for supplying the output terminal, as the output signal, with a sequence of output pulses that rise and fall when the input signal exceeds the threshold levels in absolute value. According to this invention the transistor means comprises a first transistor pair comprising a first and a second transistor having emitter electrodes connected in common, a second transistor pair comprising a third and a fourth transistor having emitter electrodes connected in common, a first and a second constant-current circuit grounding the emitter electrodes of the transistors of the first and the second transistor pairs, respectively, to allow a preselected current to flow through each thereof, biasing means for biasing base electrodes of the first and the third transistors higher than base electrodes of the second and the fourth transistors, respectively, a connection between collector electrodes of the first and the third transistors and the power supply terminal, input means connected to the input terminal for superposing the input signal on each of the base bias voltages of the second and the third transistors, and output means coupled to collector electrodes of the second and the fourth transistors and the output and the power supply terminals for supplying the output signal to the output terminal. The differences between the base bias voltages of the first and the second transistors and between the base bias voltages of the third and the fourth transistors should be determined by the threshold levels for the positive and the negative components, respectively.

DESCRIPTION OF THE PREFERRED EMBODIMENTS

Figure 1:
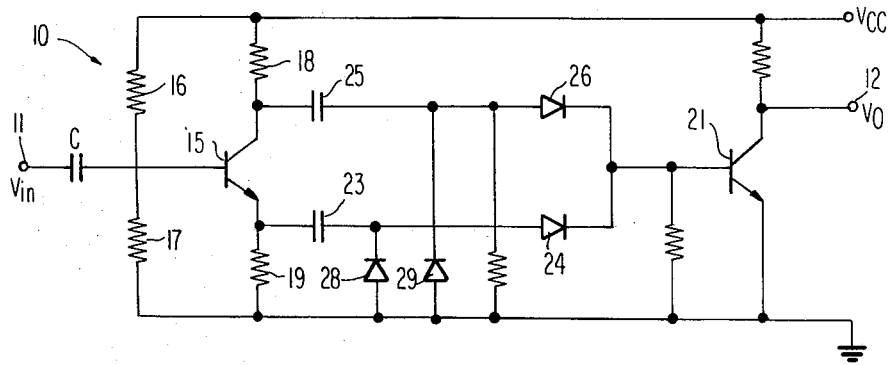
FIG. 1 shows the circuit of a conventional bipolar voltage detector.
Figure 2:
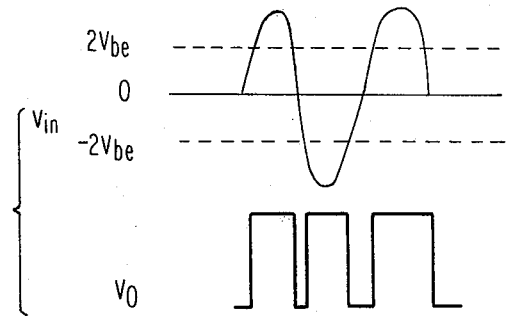
FIG. 2 shows the input-output characteristic of the detector illustrated in FIG. 1.

Referring to FIGS. 1 and 2, a conventional bipolar voltage detector 10 will be described at first for a better understanding of the present invention. The detector 10 comprises an input terminal 11 for a bipolar input signal $V_{in}$ and an output terminal 12 at which a sequence of output pulses is derived as an output signal $V_o$. As best exemplified in FIG. 2, the input signal $V_{in}$ need not be sinusoidal. The input signal $V_{in}$ is delivered to a first transistor 15 through a first capacitor C that serves as a d.c. blocking capacitor. The transistor 15 is supplied with a base bias voltage by first and second resistors 16 and 17 connected in series between a power supply terminal $V_{cc}$ for a power supply voltage $V_{cc}$ (the same reference symbol being used merely for simplicity) and ground and has collector and emitter electrodes connected to the power supply terminal $V_{cc}$ and grounded through third and fourth resistors 18 and 19, respectively. The input signal $V_{in}$ is phase-split by the transistor 15 to appear at the emitter and collector electrodes as positive and negative components, respectively. The positive components are supplied to a second transistor 21 through a second capacitor 23 serving as a d.c. blocking capacitor and a first diode 24 for rectifying the positive components. The negative components are likewise supplied to the second transistor 21 through a third capacitor 25 and a second diode 26. Third and fourth diodes 28 and 29 are for absorbing reverse surges. The detector 10 may be used in a bipolar detection system that comprises an amplifier (not shown) having an output terminal connected directly to the input terminal 11.

In the detector 10 shown in FIG. 1, the forward voltage drop $V_{fd}$ in each of the first and second diodes 24 and 26 is equal to the base-emitter forward voltage $V_{be}$ of the second transistor 21. Each of these voltages $V_{fd}$ and $V_{be}$ is typically 0.7 volt in a monolithic integrated circuit. As illustrated in FIG. 2, a rectangular output pulse appears at the output terminal 12 as the output signal $V_o$ when the absolute value $|V_{in}|$ of the input signal $V_{in}$ satisfies the following equation:

$$|V_{in}| \geq V_{fd} + V_{be} = 2V_{be}. \quad (1)$$

Equation (1) shows that the voltage detection level for each of the positive and negative components of the input signal $V_{in}$ is determined by the base-emitter forward voltage $V_{be}$ and is equal to about 1.4 volts. The voltage detection levels therefore vary with the ambient temperature. More specifically, the voltage detection sensitivity rises with the ambient temperature because the base-emitter forward voltage $V_{be}$ has a negative temperature coefficient that is typically equal to $-2$ mV/°C. Furthermore, the temperature-dependent voltage detection levels are variable only stepwise by using two or more series-connected diodes in place of either or each of the first and second diodes 24 and 26. It is otherwise necessary to vary the voltage gain of the prior-stage amplifier whose output is applied to the input terminal 11, or optionally vary the voltage detection levels of the system as a whole. The amplifier must have a high voltage gain when the system should be operable even at a low temperature. This renders the system unstable. In addition, the detector 10 has to comprise three capacitors C, 23, and 25.

Figure 3:
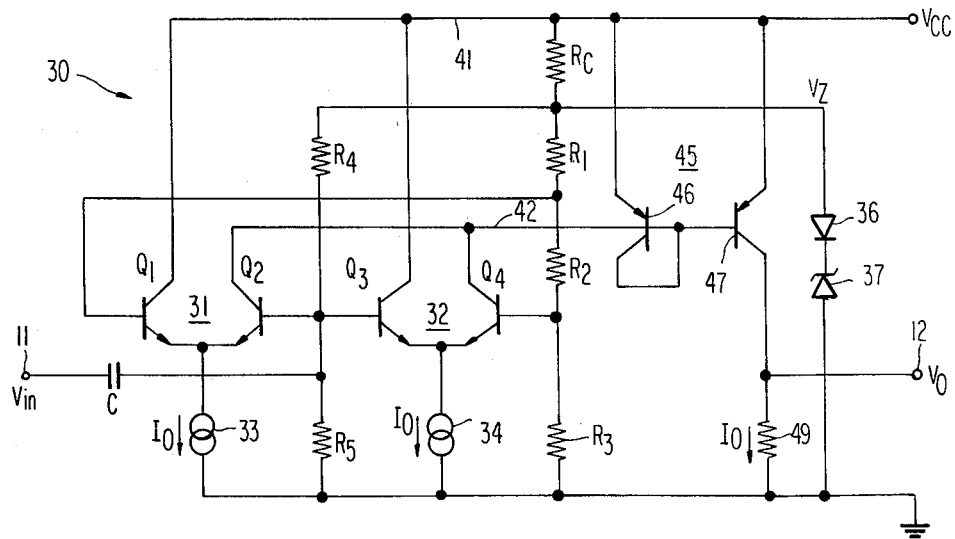
FIG. 3 shows the circuit of a bipolar voltage detector according to a first embodiment of the instant invention.

Referring now to FIG. 3, a bipolar voltage detector 30 according to a first embodiment of this invention comprises similar parts designated by like reference numerals and letters, such as 11, 12, C, and $V_{cc}$. The input and output signals and the power supply voltage are represented again by $V_{in}$, $V_o$, and $V_{cc}$. The detector 30 comprises a plurality of differential transistor pairs, such as first and second transistor pairs 31 and 32. The first transistor pair 31 comprises first and second transistors $Q_1$ and $Q_2$ having emitter electrodes connected in common to ground through a first constant-current circuit 33 for a preselected current $I_0$. The second transistor pair 32 comprises third and fourth transistors $Q_3$ and $Q_4$ having emitter electrodes, both grounded through a second constant-current circuit 34 for the preselected current $I_0$. A common resistor $R_c$, a diode 36, and a Zener diode 37 are connected in series between the power supply terminal $V_{cc}$ and ground to provide a stabilized voltage $V_z$ across the series-connected diodes 36 and 37. The first transistor $Q_1$ is supplied with a first base bias voltage $V_1$ derived by dividing the stabilized voltage $V_z$ by a first resistor $R_1$ and a series connection of second and third resistors $R_2$ and $R_3$. The second transistor $Q_2$ is supplied with a second base bias voltage $V_2$ derived by dividing the stabilized voltage $V_z$ by fourth and fifth resistors $R_4$ and $R_5$. The third transistor $Q_3$ is supplied with a third base bias voltage $V_3$ that is equal to the second base voltage $V_2$ in the example being illustrated. The second and third resistors $R_2$ and $R_3$ are for supplying a fourth base bias voltage $V_4$ to the fourth transistor $Q_4$. The first base voltage $V_1$ is higher than the second base voltage $V_2$ and the third base voltage $V_3$, which are in turn higher than the fourth base voltage $V_4$.

Further referring to FIG. 3, collector electrodes of the first and third transistors $Q_1$ and $Q_3$ are supplied with the power supply voltage $V_{cc}$ through a connection 41. Collector electrodes of the second and fourth transistors $Q_2$ and $Q_4$ are connected to a conductor 42 coupled to the output terminal 12 through a current mirror 45 that comprises first and second PNP transistors 46 and 47 having emitter electrodes connected to the power supply terminal $V_{cc}$. The first PNP transistor 46 is used as a diode. These transistors 46 and 47 have emitter areas rendered equal to each other in a monolithic integrated circuit. A load resistor 49 is connected between the output terminal 12 and ground. The input signal $V_{in}$ is supplied to base electrodes of the second and third transistors $Q_2$ and $Q_3$ through the first capacitor C that is the only capacitor used in a bipolar voltage detector according to this invention. The first and second transistor pairs 31 and 32 are for processing positive and negative components of the input signal $V_{in}$, respectively. The output signal $V_o$ is derived through the conductor 42. The peak-to-peak voltage of the output pulses of the output signal $V_o$ is determined by a product $I_0 \cdot r$, where r represents the resistance of the load resistor 49.

The stabilized voltage $V_z$ shown in FIG. 3 is scarcely dependent on the power supply voltage $V_{cc}$ and varies little with the ambient temperature because the diode 36 has a negative temperature coefficient of $-2$ mV/°C. as described hereinabove and the Zener diode 37, a positive temperature coefficient of $+2$ mV/°C. Even when a fluctuation happens to occur in the stabilized voltage $V_z$, fluctuations in the base bias voltages $V_1$ through $V_4$ are rendered small by the voltage division. The base voltages $V_1$ through $V_4$ are therefore dependent substantially only on those resistance ratios of the first through fifth resistors $R_1$ through $R_5$ which are used for the voltage division. It is now possible to give threshold voltages or voltage detection levels $V_{th(+)}$ and $V_{th(-)}$ for the positive and negative components by:

$$\begin{aligned}V_{th(+)} &= V_1 - V_2 \\ &= V_z[(R_2 + R_3)/(R_1 + R_2 + R_3) - R_5/(R_4 + R_5)]\end{aligned} \quad (2)$$

and $$\begin{aligned}V_{th(-)} &= V_3 - V_4 \\ &= V_z[R_5/(R_4 + R_5) - R_3/(R_1 + R_2 + R_3)],\end{aligned} \quad (3)$$

where $R_1$, $R_2$, $R_3$, $R_4$, and $R_5$ represent the resistances of the first through fifth resistors $R_1$ through $R_5$ (the same reference symbols being used). The threshold voltages $V_{th}$ (suffixes (+) and (−) being omitted) are therefore optionally selectable and may be as low a voltage as 0.1 volt. Furthermore, it is possible to select the threshold voltages $V_{th}$ with high precision because highly precise resistance ratios are readily realized in a monolithic integrated circuit for use in Equations (2) and (3). The peak-to-peak voltage of the output pulses is selectable by the choice of the resistance r of the load resistor 49. These merits result in an additional merit of rendering the requirements for the prior-stage amplifier moderate to thereby facilitate the design thereof.

Figure 4:
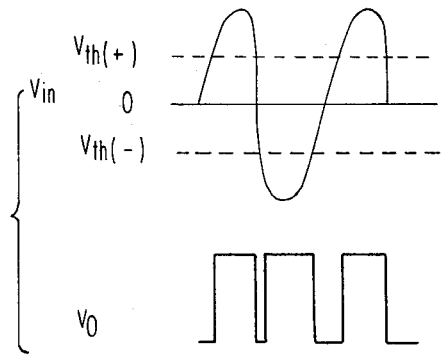
FIG. 4 shows the input-output characteristic of the detector depicted in FIG. 3.
Figure 5:
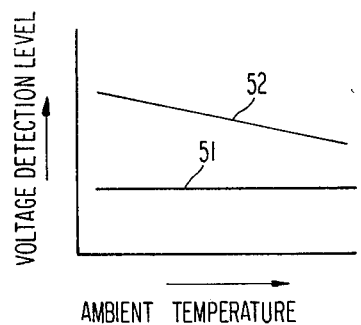
FIG. 5 exemplifies the temperature dependency of voltage detection levels of the detector shown in FIG. 3 in contrast to that for a conventional bipolar voltage detector.

Turning to FIGS. 4 and 5, the output pulses of the output signal $V_o$ quickly rise and fall as soon as the input signal $V_{in}$ exceeds in absolute value the threshold voltages $V_{th(+)}$ and $V_{th(-)}$ for the positive and negative components, respectively. It is to be understood here that zero of the input signal voltage represents in FIG. 4 the common base bias voltage of the second and third transistors $Q_2$ and $Q_3$. The voltage detection levels of the bipolar voltage detector 30 are kept constant as exemplfied by a line 51 (FIG. 5). Those of a conventional bipolar voltage detector, such as 10, decrease with the ambient temperature as described hereinabove and shown by another line 52.

Figure 6:
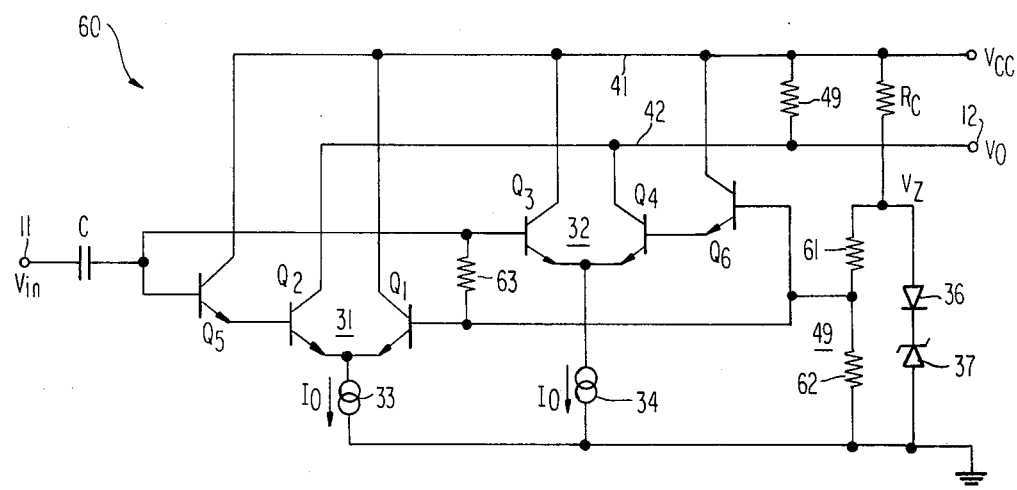
FIG. 6 shows the circuit of a bipolar voltage detector according to a second embodiment of this invention.

Referring to FIG. 6, a bipolar voltage detector 60 according to a second embodiment of this invention comprises similar parts designated by like reference numerals and letters as in FIG. 3. The load resistor 49 is connected between the conductor 42 for the collector electrodes of the second and fourth transistors $Q_2$ and $Q_4$ and the power supply terminal $V_{cc}$. The first transistor $Q_1$ is supplied with a first base bias voltage $V_1$ derived by dividing the stabilized voltage $V_z$ by first and second resistors 61 and 62. The first base voltage $V_1$ is supplied to the base electrode of a first auxiliary transistor $Q_5$ through a common base resistor 63 to derive a second base bias voltage $V_2$ for the second transistor $Q_2$ from the emitter electrode of the auxiliary transistor $Q_5$. The first base voltage $V_1$ is supplied also to the base electrode of a second auxiliary transistor $Q_6$ to produce a third base bias voltage $V_3$ for the fourth transistor $Q_4$ from the emitter electrode of the second auxiliary transistor $Q_6$. The third transistor $Q_3$ is supplied with a fourth base bias voltage $V_4$ from a point of connection between the common base resistor 63 and the base electrode of the first auxiliary transistor $Q_5$. The input signal $V_{in}$ is superposed on the second base voltage $V_2$ at the base of the second transistor $Q_2$ and on the fourth base bias voltage $V_4$ at the base of the third transistor $Q_3$.

Figure 7:
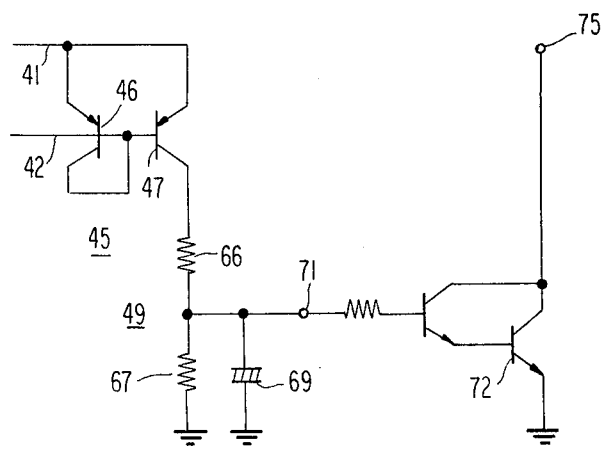
FIG. 7 shows a portion of an AGC circuit comprising a modification of the detector illustrated in FIG. 6.

Finally referring to FIG. 7, a modification of the bipolar voltage detector 60 according to the second embodiment of this invention comprises a current mirror 45 comprising first and second PNP transistors 46 and 47 as in FIG. 3. The load resistor 49 comprises a first load resistor 66 connected to the conductor 42 through the current mirror 45 and a second load resistor 67 between the resistor 66 and ground. It is therefore possible to understand the portion of the bipolar voltage detector shown in FIG. 7 to be a modification of the detector 30 illustrated with reference to FIG. 3. In any event, a sequence of output pulses of a peak-to-peak voltage equal to $I_0.r'$ is developed across the second load resistor 67 where $r'$ represents the resistance of this resistor 67. A capacitor 69 of a relatively large capacity, such as an electrolytic capacitor, is connected parallel to the second load resistor 67. A smoothed voltage is therefore obtained at a d.c. terminal 71 connected to the ungrounded electrode of the electrolytic capacitor 69. The smoothed voltage is supplied to a transistor 72 for automatically controlling the gain of an amplifier (not shown) having an input terminal connected to an AGC terminal 75. More particularly, the impedance of the AGC transistor 72 varies with the smoothed voltage. The gain of the amplifier is therefore controlled in compliance with the ratio of an input resistance of a resistor (not shown) connected between a signal source (not shown) and the AGC terminal 75 to the impedance.

While this invention has thus far been described in specific conjunction with a few preferred embodiments thereof, it is now obvious to those skilled in the art to carry this invention into effect in various manners without departing from the spirit of this invention set forth in the appended claims. As described hereinabove in connection with FIG. 3, a bipolar voltage detector according to this invention may comprise at least one more differential transistor pair in addition to the two pairs 31 and 32. The stabilized voltage $V_z$ may be provided by any other means.

What is claimed is:

1. In a bipolar voltage detector comprising an input terminal for a bipolar input signal, an output terminal for an output signal, a power supply terminal for a power supply voltage, and transistor means connected to said input, said output, and said power supply terminals and having threshold levels predetermined for positive and negative components of said input signal for supplying said output signal, the improvement wherein said transistor means comprises:
   a first transistor pair comprising a first and a second transistor having emitter electrodes connected in common,
   a second transistor pair comprising a third and a fourth transistor having emitter electrodes connected in common,
   a first and a second constant current circuit grounding the emitter electrodes of the transistors of said first and said second transistor pairs, respectively, to allow a preselected current to flow through each thereof,
   biasing means for biasing base electrodes of said first and said thid transistors higher than base electrodes of said second and said fourth transistors, respectively, the differences between the base bias voltages of said first and said second transistors and between the base bias voltages of said third and said fourth transistors being determined by the threshold levels for said positive and said negative components, respectively,
   a connection between collector electrodes of said first and said third transistors and said power supply terminal,
   input means connected to said input terminal for superposing said input signal on each of the base bias voltages of said second and said third transistors,
   output means coupled to collector electrodes of said second and said fourth transistors and said output terminal for transferring the collector outputs of said first ǎnd said fourth transistors to said output terminal, and
   wherein said biasing means comprises means for producing a stabilized voltage, and resistors for dividing said stabilized voltage into the base bias voltages of said first through said fourth transistors, the base bias voltages of said second and said third transistors being equal to each other.

2. A bipolar voltage detector as claimed in claim 1 wherein said output means comprises:
   a load resistor between said output terminal and ground; and
   a current mirror between the collector electrodes of said second and said fourth transistors, said output terminal, and said power supply terminal.

3. A bipolar voltage detector as claimed in claim 1, wherein said output means comprises:
   a conductor between the collector electrodes of said second and said fourth transistors and said output terminal; and
   a load resistor between said conductor and said power supply terminal.

* * * * *